(12) United States Patent
Kameshima et al.

(10) Patent No.: US 7,791,034 B2
(45) Date of Patent: Sep. 7, 2010

(54) IMAGING APPARATUS, RADIATION IMAGING APPARATUS, AND RADIATION IMAGING SYSTEM

(75) Inventors: Toshio Kameshima, Kumagaya (JP); Tadao Endo, Honjo (JP); Tomoyuki Yagi, Honjo (JP); Katsuro Takenaka, Kodama-gun (JP); Keigo Yokoyama, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/366,354

(22) Filed: Feb. 5, 2009

(65) Prior Publication Data

US 2009/0146071 A1    Jun. 11, 2009

Related U.S. Application Data

(63) Continuation of application No. 12/038,346, filed on Feb. 27, 2008, which is a continuation of application No. 11/696,781, filed on Apr. 5, 2007, now Pat. No. 7,408,167.

(30) Foreign Application Priority Data

Apr. 27, 2006   (JP)   ............... 2006-124144

(51) Int. Cl.
    G01T 1/24   (2006.01)
(52) U.S. Cl. ................................. 250/370.09
(58) Field of Classification Search ........... 250/370.09, 250/370.01, 370.08, 336.1; 378/98.8
    See application file for complete search history.

(56) References Cited

U.S. PATENT DOCUMENTS

| 5,790,191 | A  | 8/1998  | Zhang ...................... 348/300 |
| 6,952,015 | B2 | 10/2005 | Kameshima ........... 250/370.11 |
| 6,952,464 | B2 | 10/2005 | Endo ..................... 378/98.11 |
| 6,985,555 | B2 | 1/2006  | Endo ..................... 378/98.11 |
| 7,002,157 | B2 | 2/2006  | Kameshima ........... 250/370.11 |
| 7,012,260 | B2 | 3/2006  | Endo ..................... 250/370.11 |
| 7,138,639 | B2 | 11/2006 | Kameshima ........... 250/370.11 |
| 7,154,099 | B2 | 12/2006 | Endo ..................... 250/370.11 |
| 7,227,926 | B2 | 6/2007  | Kameshima et al. ....... 378/98.9 |

(Continued)

FOREIGN PATENT DOCUMENTS

EP    0 796 000 A2    9/1997

(Continued)

OTHER PUBLICATIONS

Search Report issued in European counterpart application No. 07106042.0-2202.

*Primary Examiner*—David P Porta
*Assistant Examiner*—Marcus H Taningco
(74) *Attorney, Agent, or Firm*—Fitzpatrick, Cella, Harper & Scinto

(57) ABSTRACT

An imaging apparatus capable of reducing a line noise artifact in a simple configuration without complicated operations includes: a plurality of pixels arranged in row and column directions and having a photoelectric conversion element and a switch element; a plurality of signal wirings connected to the plurality of switch elements in the column direction; a read-out circuit connected to the plurality of signal wirings; and a power source for supplying a voltage to the photoelectric conversion element. With the configuration, the plurality of pixels are classified into a plurality of groups, and the power sources are independently provided for each of the plurality of groups.

4 Claims, 16 Drawing Sheets

U.S. PATENT DOCUMENTS

| | | | |
|---|---|---|---|
| 2001/0012070 A1 | 8/2001 | Endo et al. | 348/302 |
| 2001/0033336 A1 | 10/2001 | Kameshima et al. | 348/300 |
| 2002/0005520 A1 | 1/2002 | Mochizuki et al. | 257/74 |
| 2002/0044700 A1 | 4/2002 | Yukawa et al. | 383/312 |
| 2004/0027472 A1 | 2/2004 | Endo et al. | 384/208 |
| 2005/0109927 A1 | 5/2005 | Takenaka et al. | 250/252.1 |
| 2005/0199834 A1 | 9/2005 | Takenaka et al. | 250/580 |
| 2005/0200720 A1 | 9/2005 | Kameshima et al. | 348/220.1 |
| 2005/0220269 A1 | 10/2005 | Endo et al. | 378/114 |
| 2005/0238249 A1 | 10/2005 | Okamura | 382/274 |
| 2005/0264665 A1 | 12/2005 | Endo et al. | 348/308 |
| 2006/0119719 A1 | 6/2006 | Kameshima | 348/308 |
| 2006/0192130 A1 | 8/2006 | Yagi | 250/370.14 |
| 2006/0289774 A1 | 12/2006 | Endo et al. | 250/370.09 |
| 2007/0040099 A1 | 2/2007 | Yokoyama et al. | 250/208.1 |
| 2007/0069144 A1 | 3/2007 | Kameshima | 250/370.09 |
| 2007/0080299 A1 | 4/2007 | Endo et al. | 250/370.09 |
| 2007/0096032 A1 | 5/2007 | Yagi et al. | 250/370.11 |
| 2007/0115379 A1 | 5/2007 | Endo et al. | 348/308 |
| 2007/0125952 A1 | 6/2007 | Endo et al. | 250/369 |
| 2007/0131843 A1 | 6/2007 | Yokoyama et al. | 250/205 |
| 2007/0183573 A1 | 8/2007 | Kameshima et al. | 378/98.9 |
| 2007/0210258 A1 | 9/2007 | Endo et al. | 250/370.09 |
| 2007/0291904 A1 | 12/2007 | Takenaka et al. | 378/207 |
| 2007/0297567 A1 | 12/2007 | Takenaka et al. | 378/98.2 |
| 2008/0011958 A1 | 1/2008 | Endo et al. | 250/370.08 |
| 2008/0013686 A1 | 1/2008 | Kameshima et al. | 378/98 |
| 2008/0029688 A1 | 2/2008 | Yagi et al. | 250/208.1 |
| 2008/0054182 A1 | 3/2008 | Yokoyama et al. | 250/370.09 |
| 2008/0083876 A1 | 4/2008 | Endo et al. | 250/369 |
| 2009/0014661 A1 | 1/2009 | Yagi et al. | 250/370.11 |

FOREIGN PATENT DOCUMENTS

| | | |
|---|---|---|
| EP | 0 905 971 A2 | 3/1999 |
| EP | 984316 | 8/1999 |
| EP | 1067606 | 4/2000 |
| EP | 1162831 | 12/2001 |
| JP | 2001-340324 | 12/2001 |

DISPLAYED IMAGE EXAMPLE

PROFILE

LINE NOISE

IMAGING APPARATUS, RADIATION IMAGING APPARATUS, AND RADIATION IMAGING SYSTEM

CROSS-REFERENCE TO RELATED APPLICATIONS

This application is a continuation of application Ser. No. 12/038,346, filed Feb. 27, 2008, which is a continuation of application Ser. No. 11/696,781, filed Apr. 5, 2007, now U.S. Pat. No. 7,408,167, and claims benefit of the filing date of those applications, and priority benefit of the filing date of Japanese Patent Application no. 2006-124144, filed Apr. 27, 2006. The entire disclosure of each of the mentioned prior applications is incorporated herein by reference.

BACKGROUND OF THE INVENTION

1. Field of the Invention

The present invention relates to an imaging apparatus, a radiation imaging apparatus, and a radiation imaging system. For the purpose of the present specification, "radiation" is intended to include electromagnetic waves such as X-rays and γ-rays, as well as α-rays and β-rays.

2. Description of the Related Art

Recently, flat panel type photoelectrical conversion apparatuses and radiation imaging apparatuses have become well known. They are made of amorphous silicon and polysilicon formed as film on an insulating substrate of glass and the like, and structured by two-dimensionally arranging pixels configured by photoelectric conversion elements and TFTs in an area sensor array. These apparatuses normally transfer a signal to a read-out circuit on the basis of charge and read it by performing matrix driving using a TFT on the charge photoelectrically converted by a photoelectric conversion element.

The conventional flat panel type area sensor has a sensor array obtained by two-dimensionally arranging pixels configured by a PIN type photodiode of amorphous silicon and a thin film transistor (TFT) formed on a glass substrate, and is matrix-driven. To the common electrode of the PIN type photodiode of each pixel, a bias voltage is applied commonly through bias wiring over the area sensor from one power source. The gate electrode of the TFT of each pixel is commonly connected to the drive wiring in a row direction, and each drive wiring is connected to a drive circuit configured by a shift register etc.

On the other hand, the source electrode of each TFT is commonly connected to the signal wiring in a column direction, and connected to a read out circuit configured by an operational amplifier, a sample and hold circuit, an analog multiplexer, a buffer amplifier, etc. In the read-out circuit, reference potential is supplied from a common power source to one input terminal of the operational amplifier provided corresponding to each signal wiring.

An analog signal output from the read-out circuit is digitized by an AD converter, processed by an image processing unit configured by memory, processor, etc., and is output to a display device such as a monitor or stored in a record device such as a hard disk.

Relating to a flat panel type photoelectric conversion apparatus using a read-out circuit and a driving circuit for matrix driving of an area sensor array to obtain an image signal or to a radiation apparatus, detailed information is described in U.S. Patent Application Publication No. 2001-012070, Japanese Patent Application Laid-Open No. 2001-340324, and U.S. Pat. No. 6,952,015.

Each of these documents describes, in addition to the basic structure and operation of the area sensor, the configuration of the read out circuit having the amplifier at the initial stage provided corresponding to each common signal wiring. Some documents disclose the configuration of reducing or amending a structural error, that is, an artifact, such as line noise.

SUMMARY OF THE INVENTION

In a radiation imaging apparatus for use in a medical radiographing system etc., the noise characteristic of the system can affect the dosage of exposure to radiation of an object. Therefore, it requires stricter noise performance than consumer products.

In such medical systems, lower-noise systems are required to realize an imaging system capable of performing fluoroscopic radiographing (that is, moving image radiographing) as compared with the device for still image radiographing, which has not been satisfied by the conventional technology.

Especially, in various kinds of noise, line noise is caused by matrix drive in which the configuration of an area sensor and a read out circuit, a resetting operation, and a sampling and holding operation are collectively performed by drive wiring connected to a plurality of switch elements in the row direction. Since the line noise is a structural error, that is, an artifact, it becomes more obvious than random noise in light of the visibility of a person, degrades image quality, or reduces diagnosis capability.

The above-mentioned conventional technology includes no practical descriptions of the configuration of a radiation imaging apparatus capable of reducing in real time the line noise artifact having low intensity at a spatially low frequency without the cost of significant pixels.

The present invention aims at providing an imaging apparatus, a radiation imaging apparatus, and a radiation imaging system capable of acquiring a good radiographed image which is appropriate for a medical X-ray fluoroscopic radiographing system etc. and has a sufficient radiographic area and display immediacy with an artifact by the line noise suppressed.

The imaging apparatus according to the present invention includes: a plurality of pixels arranged in row and column directions and having a photoelectric conversion element and a switch element; a plurality of signal wirings connected to the plurality of switch elements in the column direction; a read-out circuit connected to the plurality of signal wirings; and a power source for supplying a voltage to the photoelectric conversion element. With the configuration, the plurality of pixels are classified into a plurality of groups, and the power sources are independently provided for each of the plurality of groups.

The radiation imaging apparatus according to the present invention includes: a plurality of pixels arranged in row and column directions and having a conversion element for converting radiation into charge and a switch element for transferring a signal on a basis of the charge; a plurality of signal wirings connected to the plurality of switch elements in the column direction; a read-out circuit connected to the plurality of signal wirings; and a power source for supplying a voltage to the conversion element. With the configuration, the pixels are classified into a plurality of groups, and the power sources are independently provided for each of the plurality of groups.

According to the present invention, satisfactory radiographed images can be acquired with artifacts due to line noise suppressed. Furthermore, a line noise artifact caused by the fluctuation of a power source (power source noise) can also be reduced in a simple configuration without using complicated operations.

Further features of the present invention will become apparent from the following description of exemplary embodiments with reference to the attached drawings.

DESCRIPTION OF THE EMBODIMENTS

First Mode for Embodying the Present Invention

Figure 13A:
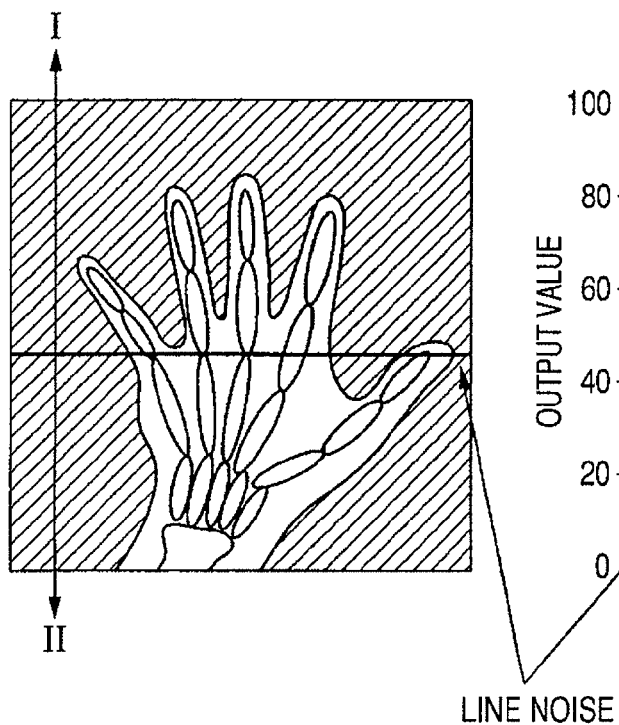
FIGS. 13A and 13B are explanatory views describing the problem of the radiation imaging apparatus.
Figure 13B:
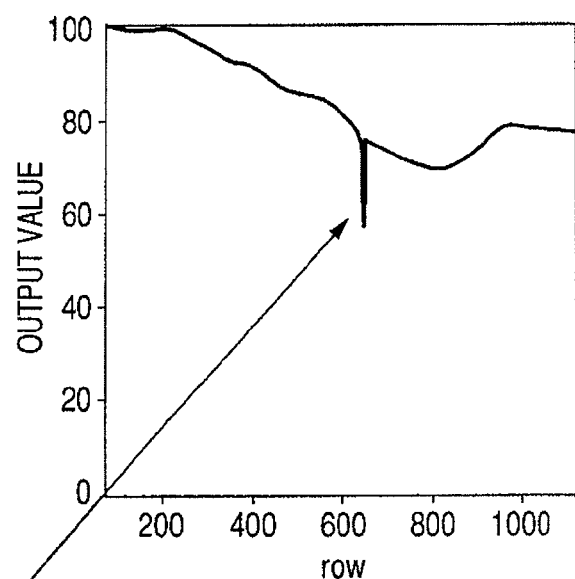

FIG. 13 illustrates an example of an image of line noise occurring in the reading of an object during radiography. FIG. 13A illustrates an acquired image on a display. FIG. 13B illustrates a column profile between I-II of the image of FIG. 13A. The horizontal axis indicates the column of an image, and the vertical axis indicates an output value of a sensor, that is, the density of an image. In FIG. 13, the image has line noise of relatively high intensity and spatial frequency, thereby considerably degrading the image quality. The degradation of image quality can occur with line noise of lower intensity and spatial frequency.

The inventor of the present invention has empirically proved that structural line noise can incur visual degradation of image quality when the following equation (1) holds:

$$s\text{pixel}/10 < s\text{line} \tag{1}$$

where spixel indicates the standard deviation of each output pixel of the area sensor array in the dark state, that is, random noise, and sline indicates the standard deviation with respect to the average value of output pixels for each gate line, that is, line noise. Thus, as compared with the random noise of pixels, very low-intensity line noise can be structural artifacts and degrade image quality.

The inventor has also quantitatively proved as follows the relationship between the amount of the fluctuation of power source (power source noise) provided by the area sensor array, the read out circuit, and the drive circuit, and the amount of line noise as illustrated in FIGS. 14A, 14B, 15, and 16.

Figure 14A:
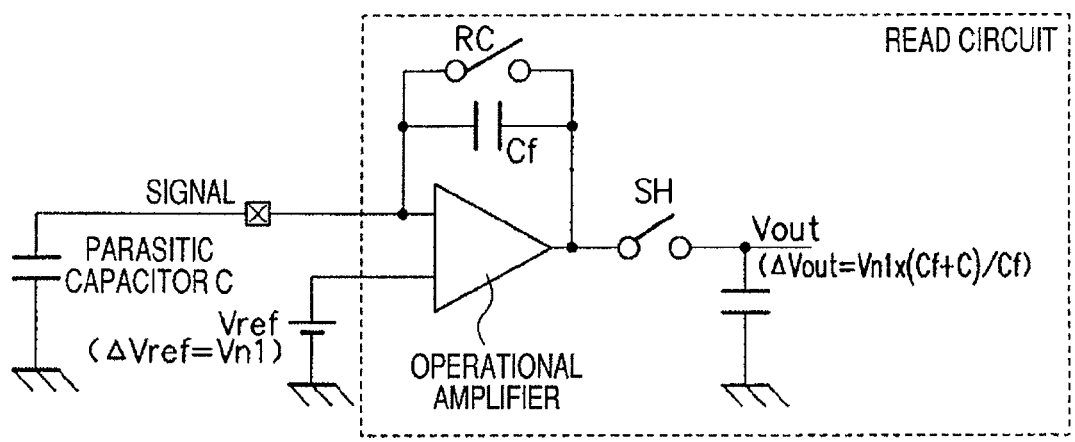
FIG. 14A is an explanatory view describing the problem of the radiation imaging apparatus (line noise source is Vref) according to the present invention.

FIG. 14A is an explanatory view illustrating the amount of line noise when the reference potential supplied to the read out circuit includes fluctuation, that is, noise. As illustrated in FIG. 14A, when the potential Vref has the fluctuation of Vn1 (Vrms) and the parasitic capacitor of the signal wiring of the area sensor array is C[F], the fluctuation by the following equation (2) is observed as output in accordance with the noise gain of the operational amplifier:

$$Vn1(Vrms) \times (Cf+C)/Cf \tag{2}$$

Figure 15:
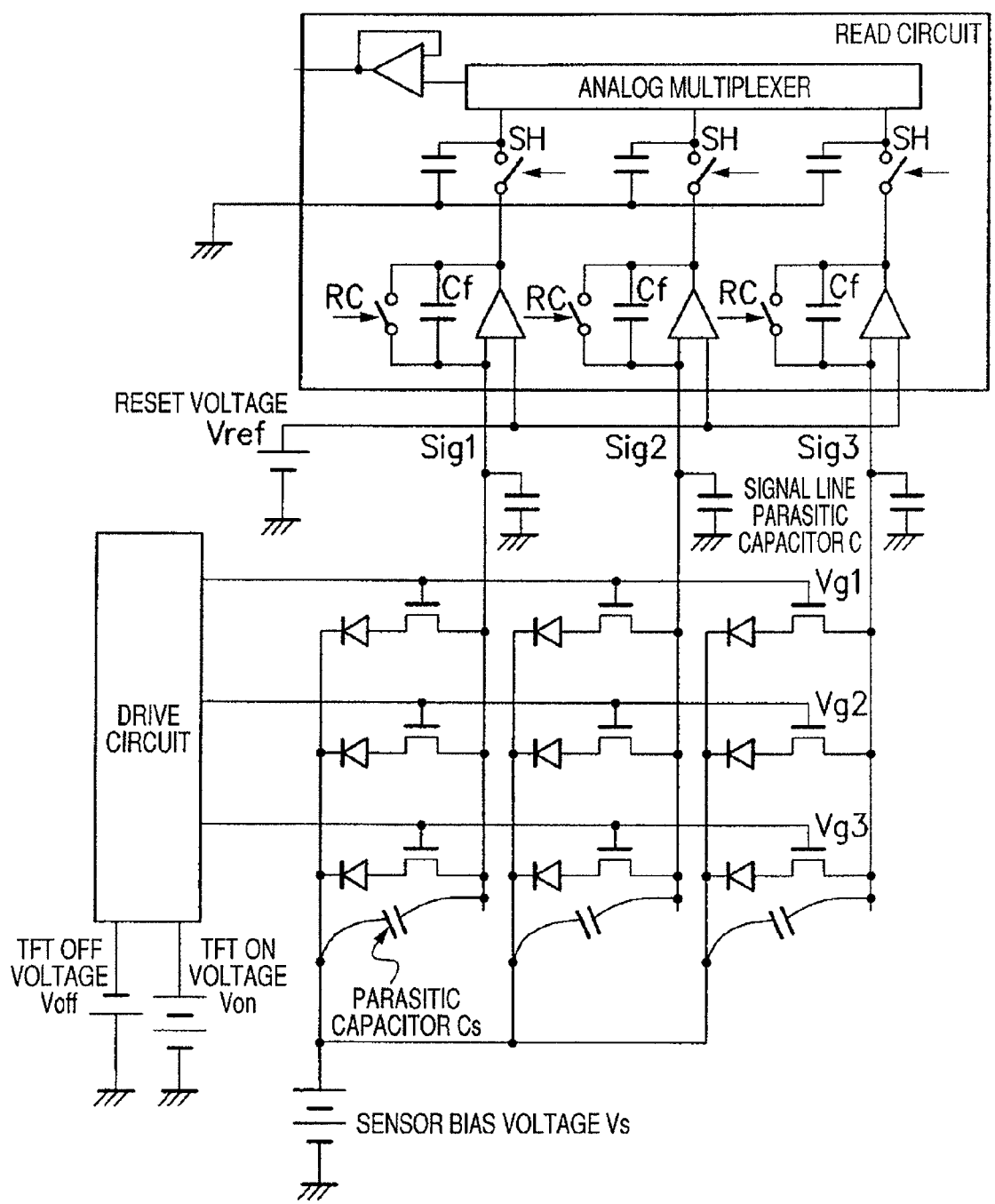
FIG. 15 is a schematic chart of the circuit describing the problem of the radiation imaging apparatus according to the present invention.
Figure 16:
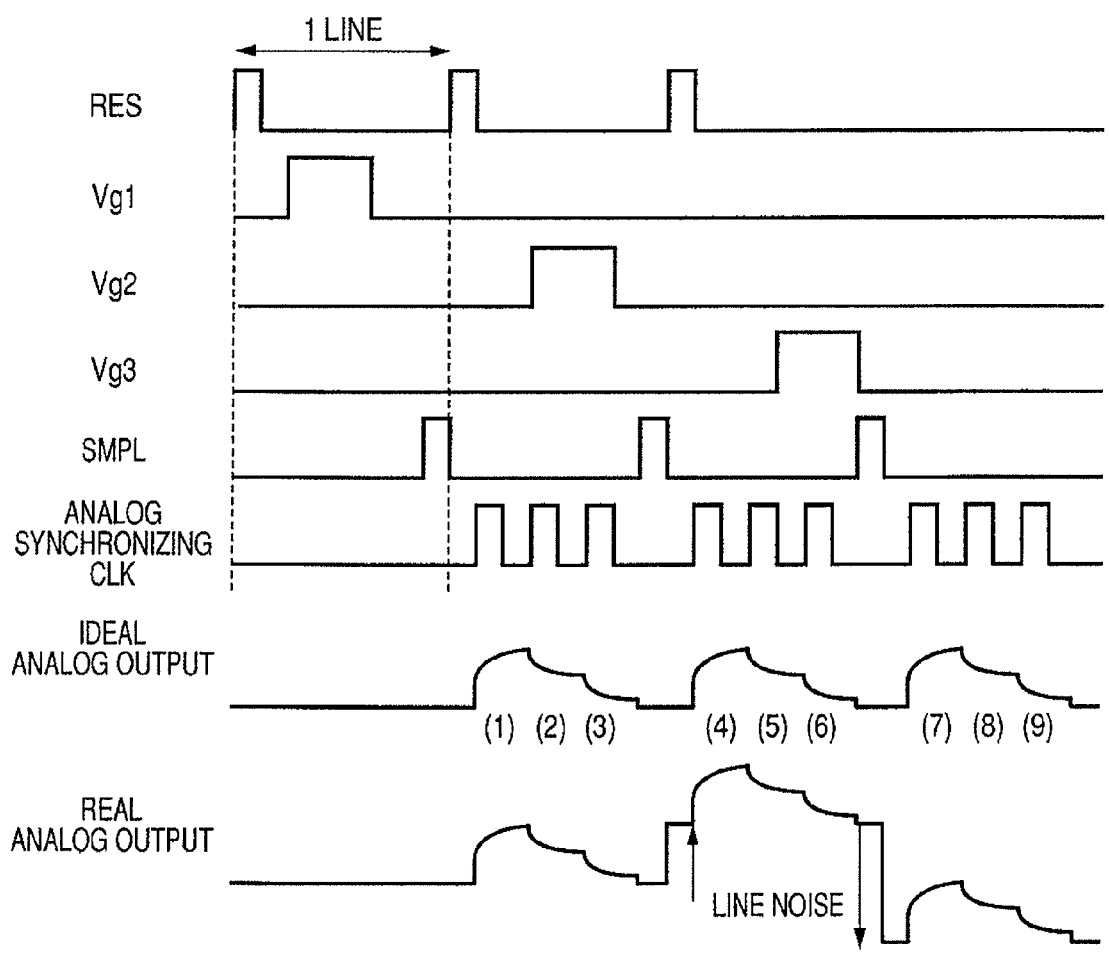
FIG. 16 is a timing chart describing the problem of the radiation imaging apparatus according to the present invention.

As illustrated in FIGS. 15 and 16, in the conventional technology, since the potential Vref is commonly provided for the read out circuit, and the reset switch RC and the sample and hold circuit SH collectively operating for each gate line of the area sensor array, the amount calculated by equation (2) is recognized as line noise.

Figure 14B:
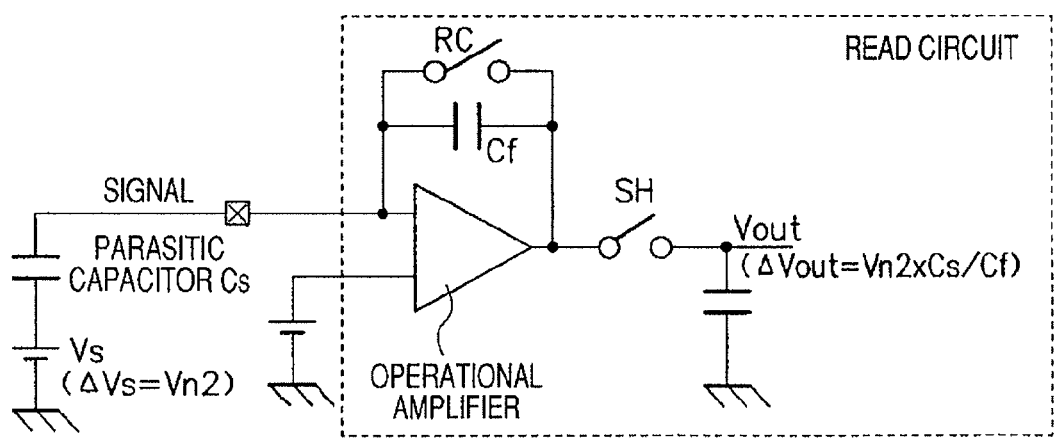
FIG. 14B is an explanatory view describing the problem of the radiation imaging apparatus (line noise source is Vs) according to the present invention.

FIG. 14B is an explanatory view of the line noise detected when each signal wiring of the area sensor array is combined at the sensor bias line parasitic capacitor Cs, and the sensor bias potential Vs has fluctuation.

As illustrated in FIG. 14B, when the sensor bias potential Vs has the fluctuation of Vn2 (Vrms), the charge Cs×Vn2 (Vrms) is applied to the read-out circuit, and the fluctuation voltage ΔVout in the following equation (3) is obtained as an output voltage Vout:

$$\Delta Vout = Vn2(Vrms) \times Cs/Cf \tag{3}$$

As with the above-mentioned potential Vref, the sensor bias potential Vs is commonly supplied to the entire area sensor array as illustrated in FIGS. 15 and 16. Since the reset switch RC and the sample and hold circuit SH are collectively operating on each drive wiring of the area sensor array, the amount calculated by equation (3) is recognized as line noise.

With a view to reducing artifacts by line noise, some of the above-mentioned documents disclose technology that can be classified into two groups.

As the first method, as described in Japanese Patent Application Laid-Open No. 2001-340324, an amendment can be made using the output of shaded masking pixels, or by obtaining the amount of line noise by analyzing images containing a masked image.

As the second method, as described in U.S. Pat. No. 6,952, 015, to reduce the line noise caused by the fluctuation (power source noise) of the area sensor array, the read-out circuit, and the drive circuit, a low pass filter is provided for each power source.

In any case, some effects are recognized in reducing line noise, but are not sufficient, in the following points. In the magnitude of its effect, the conventional technology is not recognized as sufficient.

For example, the first method is effective in removing line noise of a high spatial frequency (in pulses) and relatively high intensity. However, to amend or remove the line noise with the accuracy of about $1/10$ of the random noise of pixels, the processes for the detection of line noise and the operation algorithm are complicated, and it can be difficult to apply the technology to a system requiring display immediacy such as fluoroscopic radiographing.

Furthermore, in accordance with the rule of statistics, a sufficiently large number of masking pixels are required to obtain line noise about $1/10$ times as large as the random noise of pixels with high accuracy. Therefore, a significant pixel area can be reduced. Otherwise, when a sufficiently large number of masking pixels cannot be arranged, an error can occur by arithmetic operations.

On the other hand, the second method is effective to reduce high frequency line noise derived from the fluctuation of the power source of the area sensor array, the read out circuit, and the drive circuit. However, the response of the power source may become poor if the band of a low pass filter is reduced to increase the effect of reducing noise, or there can be the possibility of an insufficient effect if spatially very low-frequency line noise such as 1/f noise of a power source.

It is necessary to note that the above-mentioned conventional technology includes no practical descriptions of the configuration of a radiation imaging apparatus capable of reducing in real time line noise artifacts having low intensity at a spatially low frequency without the cost of significant pixels.

The first mode for embodying the present invention is described below in detail by referring to the attached drawings.

Figure 1:
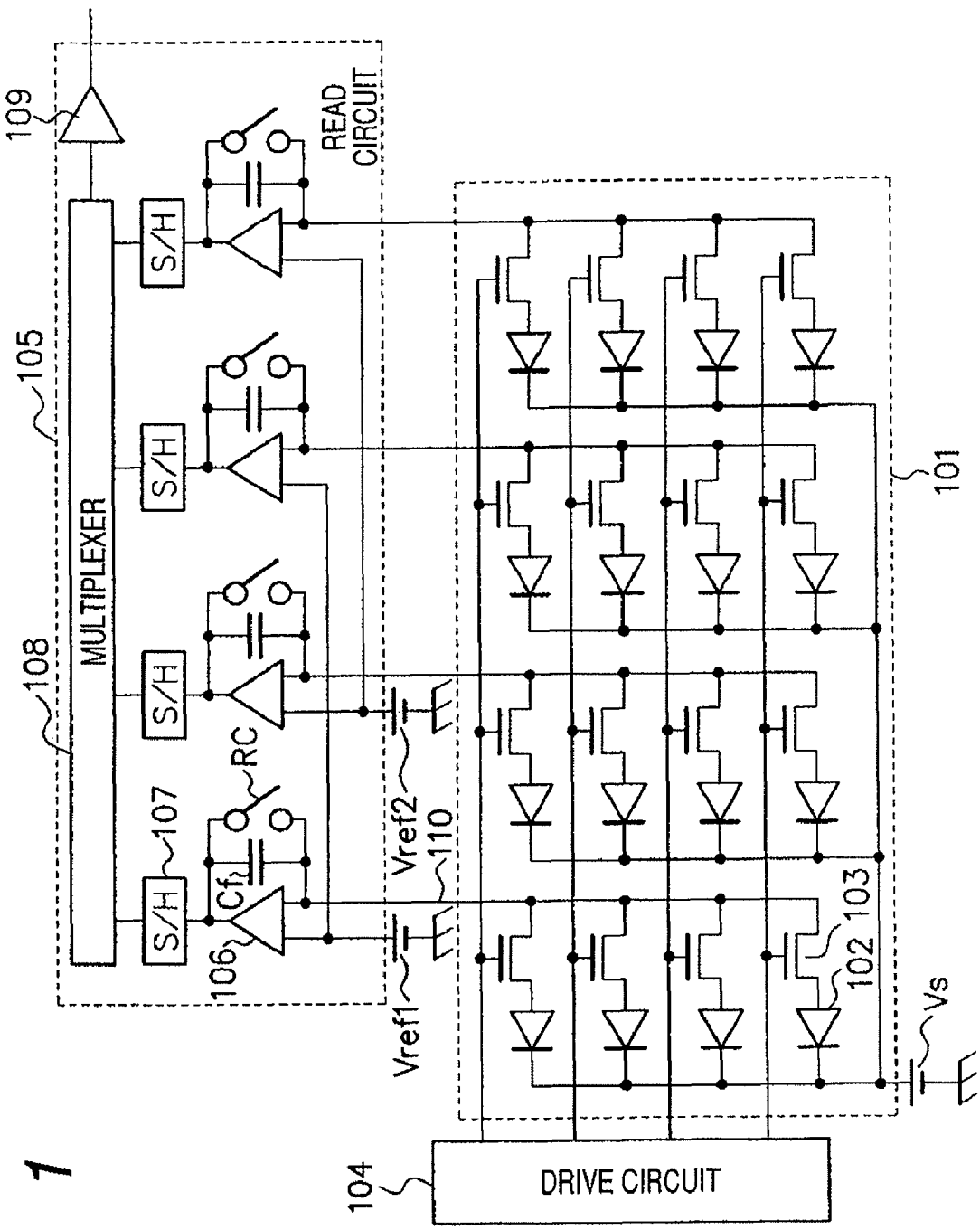
FIG. 1 is a schematic chart of the circuit of the radiation imaging apparatus according to the first mode for embodying the present invention.

FIG. 1 is a schematic chart illustrating the circuit of the radiation imaging apparatus according to the first mode for embodying the present invention. The apparatus includes a sensor array 101, a PIN type photodiode 102 as a photoelectric conversion element, a thin film transistor (TFT) 103 as a switch element. The TFT 103 has a gate, a source, and a drain electrode. A drive circuit 104 provides a voltage for drive wiring commonly connected to the gate electrodes of the plural TFTs 103 in the row direction. A read-out circuit (read out unit) 105 connected to signal wiring 110 connected to the source electrodes of the plural TFTs 103 in the column direction. The read-out circuit 105 includes an operational amplifier 106, a sample and hold circuit 107, a multiplexer 108, an output amplifier 109, a capacitor Cf for storage of charge, and a reset switch RC.

The configuration of the radiation imaging apparatus according to the present mode for embodying the present invention is described below by referring to FIG. 1. The read-out circuit 105 connected to the signal wiring 110 is divided into two systems (groups), that is, an even group and an odd group. To the operational amplifier 106 of each system (group), basically unrelated reference potential Vref1 and Vre2 can be supplied. The method of dividing the operational amplifier 106 is not limited to the even and odd groups, but the even and odd groups are preferable with the visual characteristic taken into account.

The sensor array 101 is structured by arranging in a two-dimensional array the pixels including the PIN type photodiodes (photoelectric conversion elements) 102 of non-single crystal semiconductor such as amorphous silicon arranged in the row and column directions and the TFT 103, and is matrix driven. On the common electrode side (in FIG. 1, on the cathode side of the diode) of the PIN type photodiode 102, the bias voltage Vs is applied to through the bias wiring. The gate electrode of the TFT 103 of each pixel is commonly connected to the drive wiring in the row direction, and the drive wiring is connected to the drive circuit 104 configured by a shift register etc. The signal wiring 110 is connected to one of the source electrode and the drain electrode of the plurality of TFTs 103 in the column direction.

The plurality of operational amplifiers 106 are provided corresponding to the plurality of signal wirings 110. The input terminal of the operational amplifier 106 in the odd column is connected to the power sources of the signal wiring 110 and the reference voltage Vref2. The reference voltages Vref2 and Vref2 have the same voltage values, and are generated by unrelated and independent power sources. The operational amplifier 106 configures a charge readout amplifier by connecting the charge storage capacitor Cf to the input terminal to which the signal wiring 110 is connected. The power sources of the reference voltages Vref1 and Vref2 are reference power source of the operational amplifier 106 in the read-out circuit 105.

The output of the output amplifier 109 is digitized by the AD converter, processed by the image processing unit configured by memory, a processor, etc., not shown in FIG. 1, and output to the display device such as a monitor not illustrated in FIG. 1, or stored in a record device such as a hard disk.

The light containing the object information enters the area sensor array 101 from the radiation irradiating unit. The photodiode 102 converts the light into an electrical signal by photoelectrical conversion. Furthermore, according to a reset signal, the reset switch RC provided for the operational amplifier 106 is turned on, and the charge storage capacitor Cf of the operational amplifier 106 and each signal wiring 110 are reset. Then, the transfer pulse is applied to the drive wiring in the first row, and the TFT 103 connected to the drive wiring in the first row is turned on. Thus, a signal on the basis of the charge generated by the photodiode 102 is transferred to the read-out circuit 105 through the TFT 103 and the signal wiring 110. The transferred signal is converted into a voltage by the operational amplifier 106 of the read-out circuit 105 connected to the signal wiring 110.

Next, the sample and hold circuit 107 inputs a sample and hold signal, and samples the voltage output from the operational amplifier 106. Then, the sampled voltage is held in the capacitor of the sample and hold circuit 107, and the voltage is serially converted by the multiplexer 108. The output amplifier 109 amplifies an output signal of the multiplexer 108.

Then, after the charge storage capacitor Cf of the operational amplifier 106 and each signal wiring 110 are reset by the reset switch RC, the transfer pulse is applied to the drive wiring in the second row, and the charge of the photodiode 102 in the second row is read to the read-out circuit through the TFT 103 and the signal wiring 110. A similar operation is repeated on the gate line in and after the third line, and the charge of the entire sensor array 101, that is, image output data, is read.

The reference voltage Vref1 is input to the operational amplifier 106. When the reset switch RC in the odd column is turned on, the operational amplifier 106 and the signal wiring 110 in the odd column are short-circuited, and the signal wiring 110 in the odd column is reset to the voltage Vref1/2. The reset voltage Vref1/2 of the signal wiring 110 is supplied to the anode of the photodiode 102 through the TFT 103. The power source of the reference voltage Vref1 provides a reset voltage to the photodiode 102 through the signal wiring 110 and the TFT 103.

The reference voltage Vref2 is input to the operational amplifier 106. When the reset switch RC in the even column is turned on, the operational amplifier 106 and the signal wiring 110 in the even column are short-circuited, and the signal wiring 110 in the even column is reset to the voltage Vref2/2. The reset voltage Vref2/2 of the signal wiring 110 is supplied to the anode of the photodiode 102 through the TFT 103. The power source of the reference voltage Vref2 supplies the reset voltage to the photodiode 102 through the signal wiring 110 and the TFT 103.

The plurality of pixels in the sensor array 101 are divided into a plurality of systems (group). For example, they are divided into systems in odd columns and even columns for each system (group). Power sources are independently provided for each system (group). In this example, two power sources of the reference voltages Vref1 and Vref2 are independently provided for each system (each group). The power source of the reference voltage Vref1 supplies a reset voltage to the photodiode 102 of the system (group) in the odd column. The power source of the reference voltage Vref2 supplies the reset voltage to the photodiode 102 of the system (group) in the even column.

Figure 2:
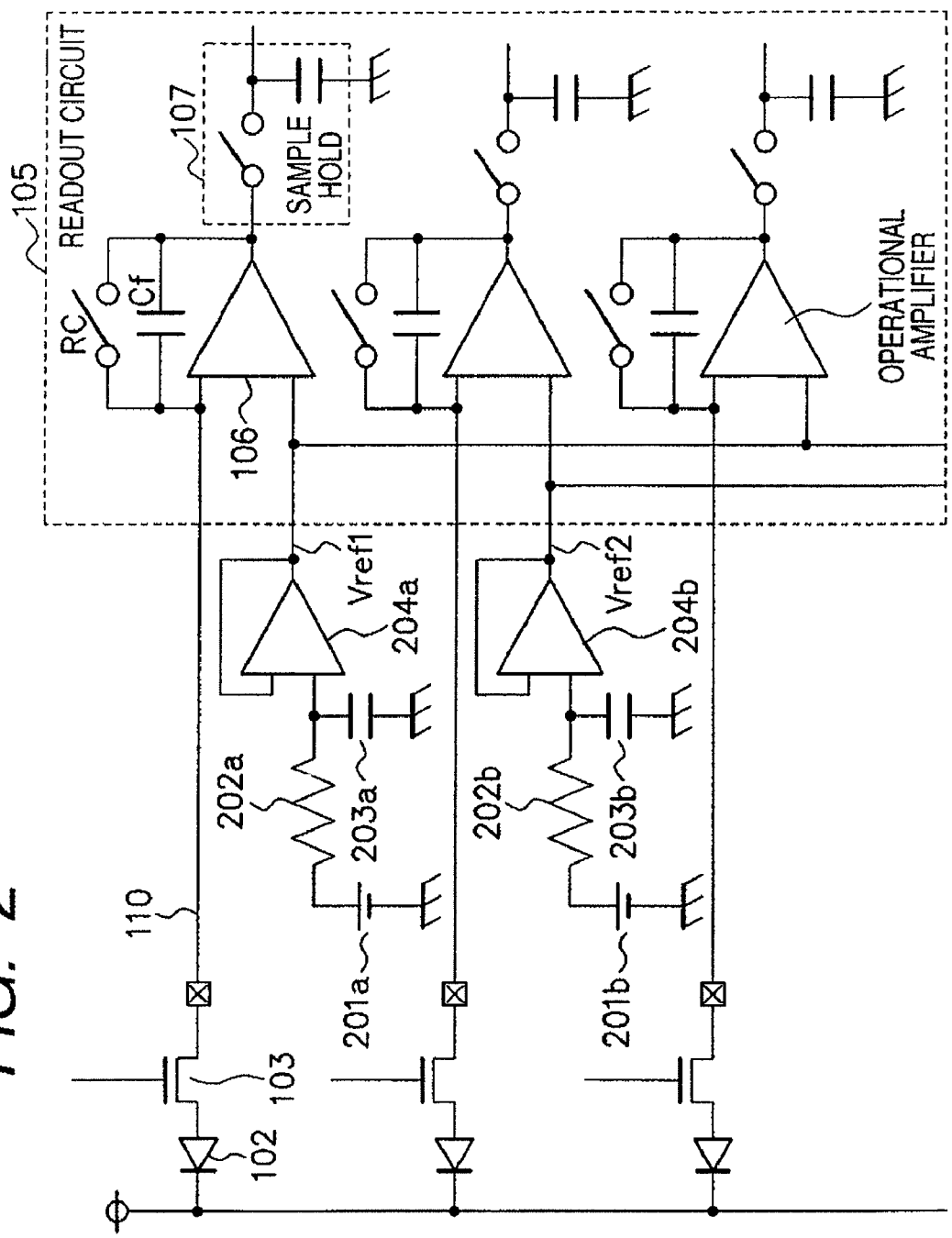
FIG. 2 is a schematic chart of the power source used for the radiation imaging apparatus according to the first mode for embodying the present invention.

FIG. 2 illustrates an example of a practical power source circuit for supplying the reference potential Vref1 and Vref2 to the read out circuit 105. The power source circuit for generating the reference potential Vref includes a voltage source 201a, a resistor 202a, a capacitor 203a, and an operational amplifier 204a. The reference potential Vref1 is input to the operational amplifier 106 in the odd column. The power source circuit for generating the reference potential Vref2 includes a voltage source 201b, a resistor 202b, a capacitor 203b, and an operational amplifier 204b. The reference potential Vref2 is input to the operational amplifier 106.

In FIG. 2, the reference potential Vref1 and Vref2 are connected to the band gap reference voltage sources 201a and 201b and low pass filters 202a, 203a, 202b, and 203b, and the operational amplifiers 204a and 204b which have a sufficiently low noise. In the circuit of this configuration, the unrelated potential Vref1 and Vref2 are supplied respectively to the even and odd units of the read out circuit 105 of the read-out circuit 105, thereby reducing the line noise value sline. The low pass filter illustrated in FIG. 2 can also be applied to each power source according to other modes for embodying the present invention.

In the sensor array 101 and the read-out circuit 105, a signal is transferred in a row unit by the drive wiring commonly connected to the TFTs 103 in the row direction, and the signal wiring 110 and the read-out circuit 105 commonly connected to the plural TFTs 103 in the column direction perform the reading process in a column unit. As illustrated in FIG. 15, when the same reference potential Vref is supplied to the operational amplifier in all columns, the fluctuation of the power source of the reference potential Vref appears as noise of the operational amplifiers in all columns. As a result, noise occurs from the reference potential Vref with the same timing in all pixel signals in one row, and is recognized as line noise. The line noise easily degrades image quality visually.

In the present mode for embodying the present invention, since the power sources of the reference potential Vref1 and Vref2 are independent, the fluctuation of the power source of the reference potential Vref2 does not occur although there arises the fluctuation of the power source of the reference potential Vref1. On the other hand, although the power source of the reference potential Vref2 fluctuates, the power source of the reference potential Vref1 does not fluctuate. As a result, no noise is generated from the reference power source of the same timing in all pixel signals in one row, and noise is diffused, thereby preventing line noise. Although there occurs the fluctuation of the reference potential Vref1 and Vref2, the fluctuation is variable and close to random noise, and the noise is not visually outstanding, thereby improving the image quality.

The above-mentioned configuration is especially effective when the 1/f noise of the operational amplifiers 204a and 204b for use in generating a power supply voltage of the reference potential Vref1 and Vref2 is high. In FIG. 2, all band gap reference voltage sources 201a and 201b, the low pass filters 202a, 203a, 202b, and 203b, and the operational amplifiers 204a and 204b are independently provided in even and odd columns. However, the present invention is not limited to this application, but only the operational amplifiers 204a and 204b can be independently configured in the even and odd columns. The power sources of the reference potential Vref1 and Vref2 have at least different operational amplifiers 204a and 204b.

Figure 3:
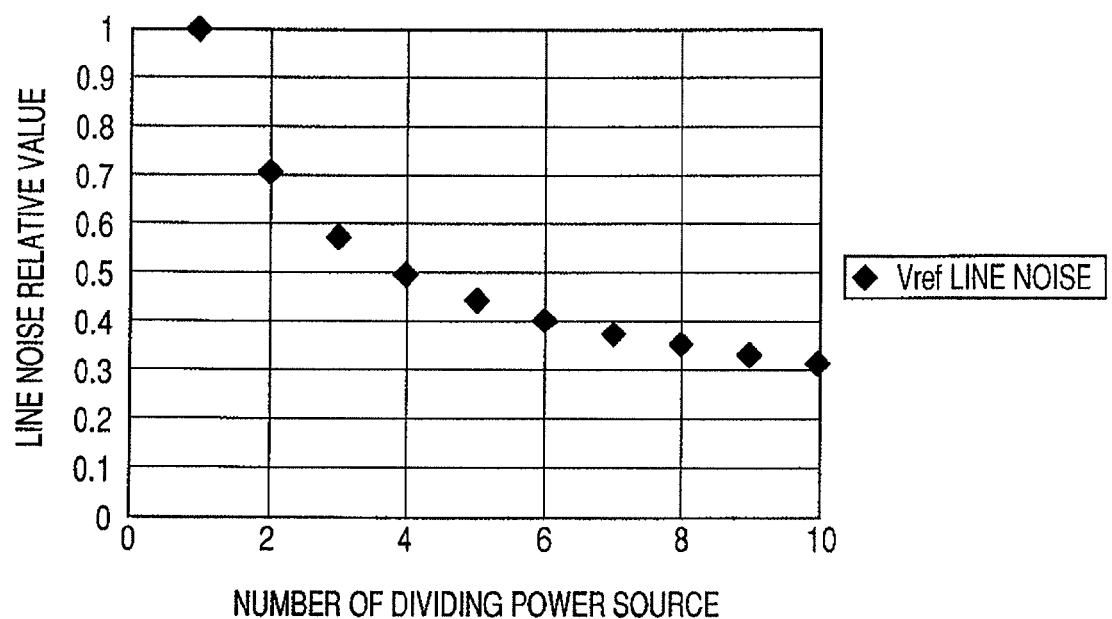
FIG. 3 is an explanatory view illustrating the effect of the first mode for embodying the present invention.

FIG. 3 is an explanatory view of the effect of reducing the line noise according to the present mode for embodying the present invention, and indicates the relationship between the number of systems (groups) (that is, the power source division number of the reference potential Vref) for dividing the read-out circuit 105 and the above-mentioned line noise value sline (relative value). In FIG. 3, when the divided even and odd columns are provided and the reference potential Vref1 and Vref2 are supplied to the operational amplifier 106, the line noise sline caused by the fluctuation of the reference potential Vref1 and Vref2 is reduced in principle to $1/\sqrt{2}$ as compared with the case where no division is made. Furthermore, it is reduced to ½ when four systems (groups) are obtained as a result of the division and unrelated power sources are supplied.

Figure 4:
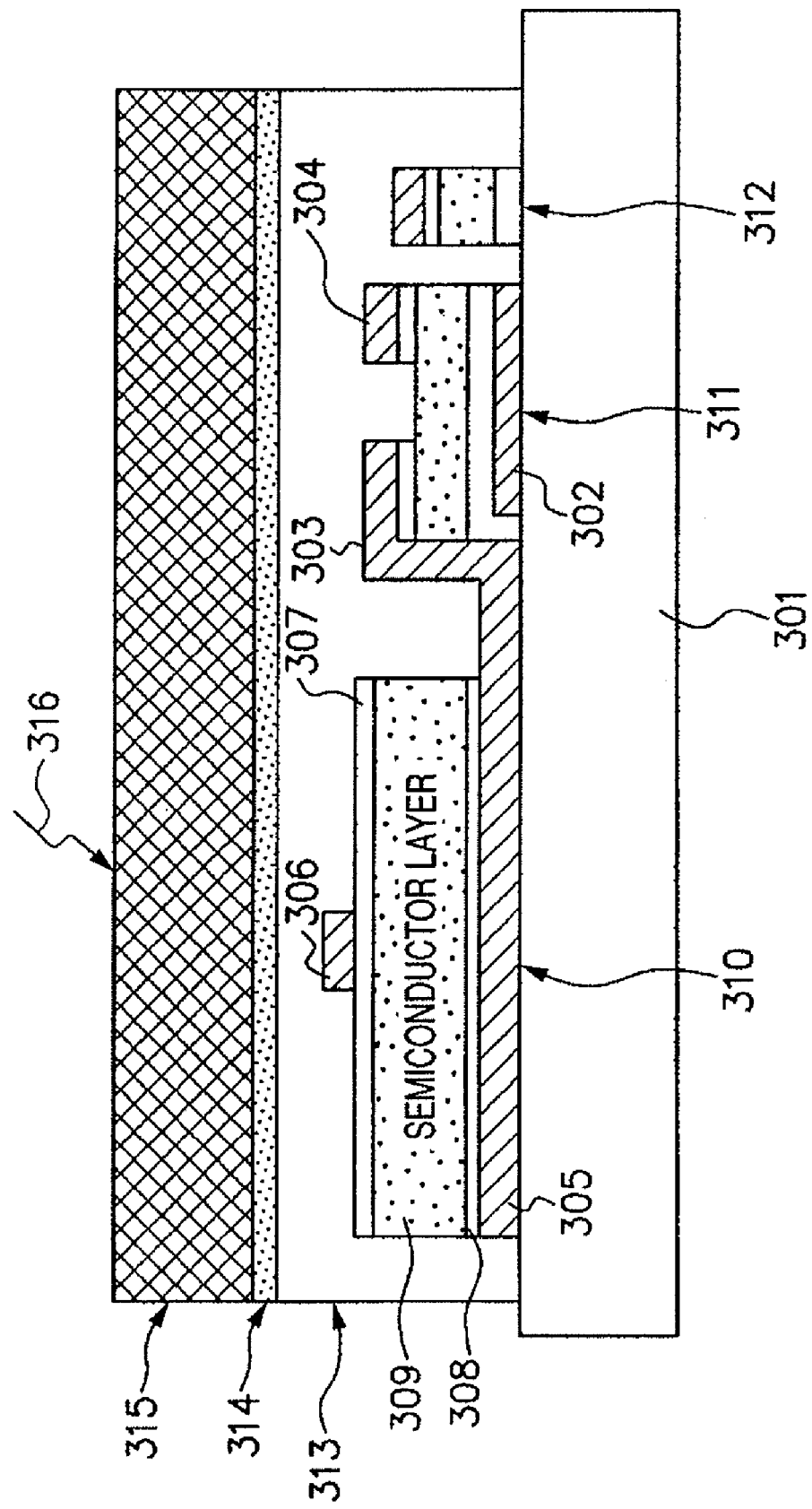
FIG. 4 is a sectional view of the pixels of an area sensor array for use in the radiation imaging apparatus according to the first mode for embodying the present invention.

FIG. 4 is a sectional view of the pixels of the area sensor array 101 used in the radiation imaging apparatus according to the present mode for embodying the present invention. On an insulating substrate 301 such as glass, a TFT 311 as a switch element and a wiring unit 312 are provided. The photodiode 310 includes an upper electrode layer 306, an n-type impurity semiconductor layer 307, an intrinsic semiconductor layer 309, a p-type impurity semiconductor layer 308, and a lower electrode layer 305. The TFT 311 includes a gate electrode 302, a drain electrode 303, and a source electrode 304. Each semiconductor layer is formed on the insulating substrate 301 using a non-single crystal semiconductor such as amorphous silicon. A protective layer 313 covers the photodiode 310, the TFT 311, and the wiring unit 312. An adhesive layer 314 is provided on the protective layer 313. A phosphor layer 315 is provided on the adhesive layer 314. Radiation 316 such as X-rays enters from above. The adhesive layer 314 is not always necessary, and the phosphor layer 315 can be evaporated directly on the protective layer 313.

The photodiode 310 of each pixel has the lower electrode layer 305, the p-type impurity semiconductor layer 308, the intrinsic semiconductor layer 309, the n-type impurity semiconductor layer 307, and the upper electrode layer 306 layered on the insulating substrate 301. The TFT 311 has the layers of the gate electrode (lower electrode) 302, a gate insulating layer (amorphous silicon nitride film), an intrinsic semiconductor layer, an n-type impurity semiconductor layer, the source electrode layer (upper electrode) 304, and the drain electrode 303. The wiring unit 312 indicates the signal wiring 110, and is connected to the source electrode 304 of the TFT 311 at each pixel. On the photodiode 310, the TFT 311, and the wiring unit 312 formed on the insulating substrate 301, the protective layer 313 such as an amorphous silicon nitride film having high transmittance for the radiation 316 is provided, and covers the entire structure. The phosphor layer 315 converts the radiation 316 such as X-rays into light of a wavelength band detected by a photoelectric conversion element. The photodiode 310 converts the light into an electrical signal (charge). The phosphor layer 315 and the photodiode 310 are conversion elements for converting the radiation 316 into an electrical signal.

The present mode for embodying the present invention has the phosphor layer (wavelength conversion member) 315 for converting radiation such as the X-rays 316 through the adhesive layer 314 above the protective layer 313 to apply the present invention to a medical radiographing system such as fluoroscopic radiographing.

The phosphor layer 315 can be made of a gadolinium system $Gd_2O_2S$:Tb and $Gd_2O_3$:Tb, etc., or cesium iodide (CsI), etc., as a main material.

The photodiode 102 of the sensor array 101 is not limited to the PIN type photodiode of amorphous silicon, but can have polysilicon or an organic material as its main material. A conversion element configured by the photodiode 102 and the phosphor layer 315 can be a direct type conversion element for directly converting into charge the radiation such as amorphous selenium, gallium arsenide, gallium phosphorus, lead iodide, mercury iodide, CdTe, or CdZnTe.

Furthermore, the material of the TFT 103 is not limited to amorphous silicon formed on an insulating substrate, but can be a TFT (switch element) using polysilicon and an organic material as a main material.

The configuration according to the present mode for embodying the present invention is especially effective in the radiation imaging apparatus using a large sensor array 101 having a large parasitic capacitor of the signal wiring 110.

Second Mode for Embodying the Present Invention

Figure 5:
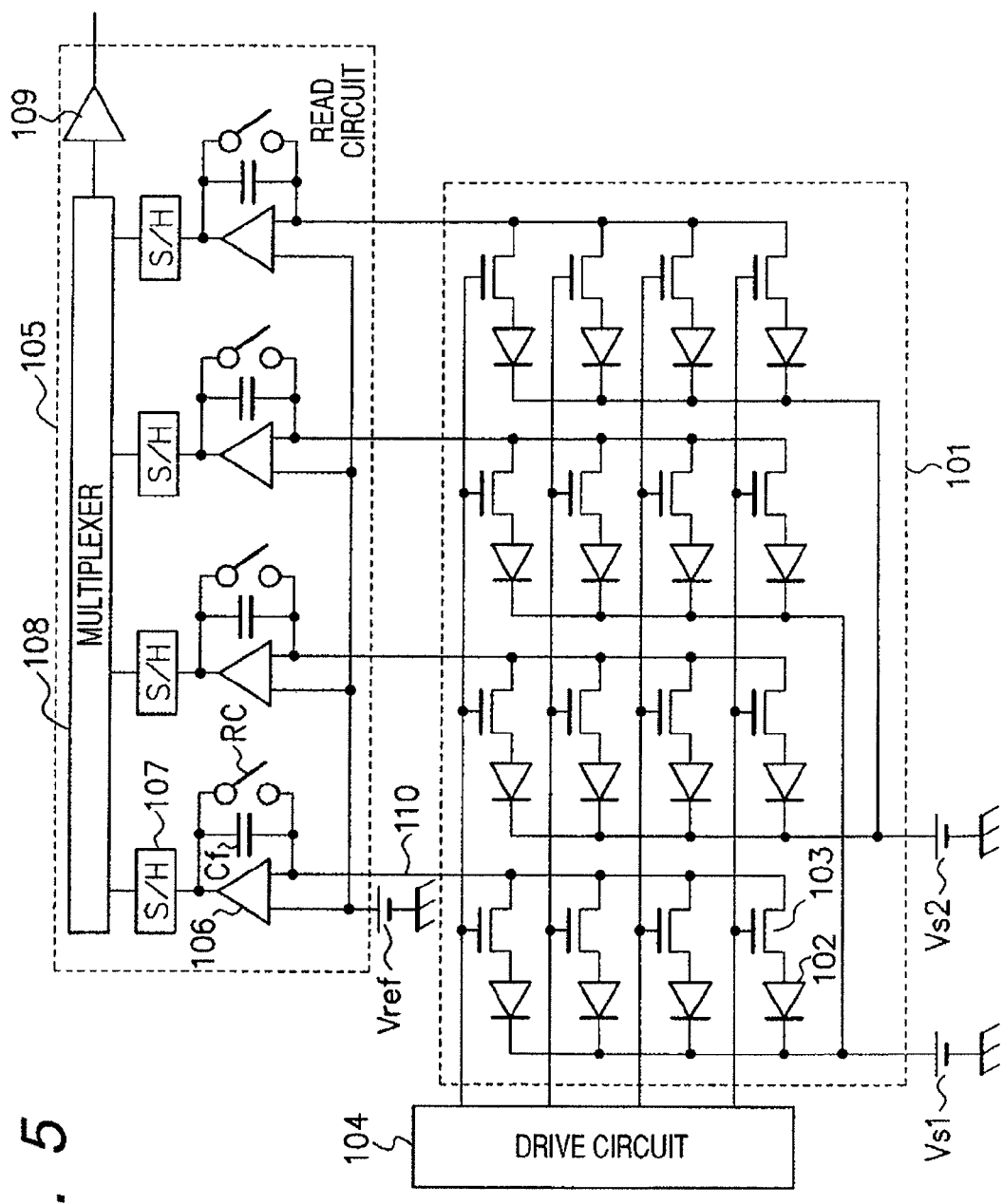
FIG. 5 is a schematic chart of the circuit of the radiation imaging apparatus according to the second mode for embodying the present invention.

FIG. 5 is a schematic chart of the radiation imaging apparatus according to the second mode for embodying the present invention. The present mode for embodying the present invention is similar to the first mode for embodying the present invention, but is fundamentally different from it in the following point. That is, unlike the case illustrated in FIG. 1, in the present mode for embodying the present invention the reference voltage Vref of the read out circuit 105 is supplied from a common power source. On the other hand, the bias wiring of the sensor array 101 is divided into two systems (groups), that is, even columns and odd columns, and is supplied from the independent power sources Vs1 and Vs2.

To the cathode of the photodiode 102 in the odd columns, the bias voltage Vs1 is provided. To the cathode of the photodiode 102 in the even columns, the bias voltage Vs2 is supplied. The bias voltages Vs1 and Vs2 have the same voltage values. The power sources of the bias voltages Vs1 and Vs2 are unrelated and dependent power source circuit. The power sources of the bias voltages Vs1 and Vs2 are the bias voltages of the photodiode 102. The reference voltages Vref of the same power source are input to the operational amplifiers 106 in all columns.

A practical method of configuring each power source of the bias voltage Vs1 and Vs2 is preferably to supply power by at least different operational amplifiers as in the case of the reference voltages Vref1 and Vref2.

The effect of the present mode for embodying the present invention is the same as in the first mode for embodying the present invention illustrated in FIG. 3. With the present configuration, the line noise component generated by the fluctuation of the bias line potential is 1/v2 in principle.

The configuration in which the bias wiring connected to the cathode of the photodiode 102 is divided into a plurality of systems (groups) is also illustrated in FIG. 23 of the above-mentioned U.S. Patent Application Publication No. 2001/012070. However, in FIG. 23 of U.S. Patent Application Publication No. 2001/012070, the bias line of a plurality of systems (groups) is exchanged by a switch, but a finally connected power source is the same power source. Therefore, U.S. Patent Application Publication No. 2001/012070 is different from the present mode for embodying the present invention, and no effect of reducing line noise can be acquired from FIG. 23 of U.S. Patent Application Publication No. 2001/012070.

Third Mode for Embodying the Present Invention

Figure 6:
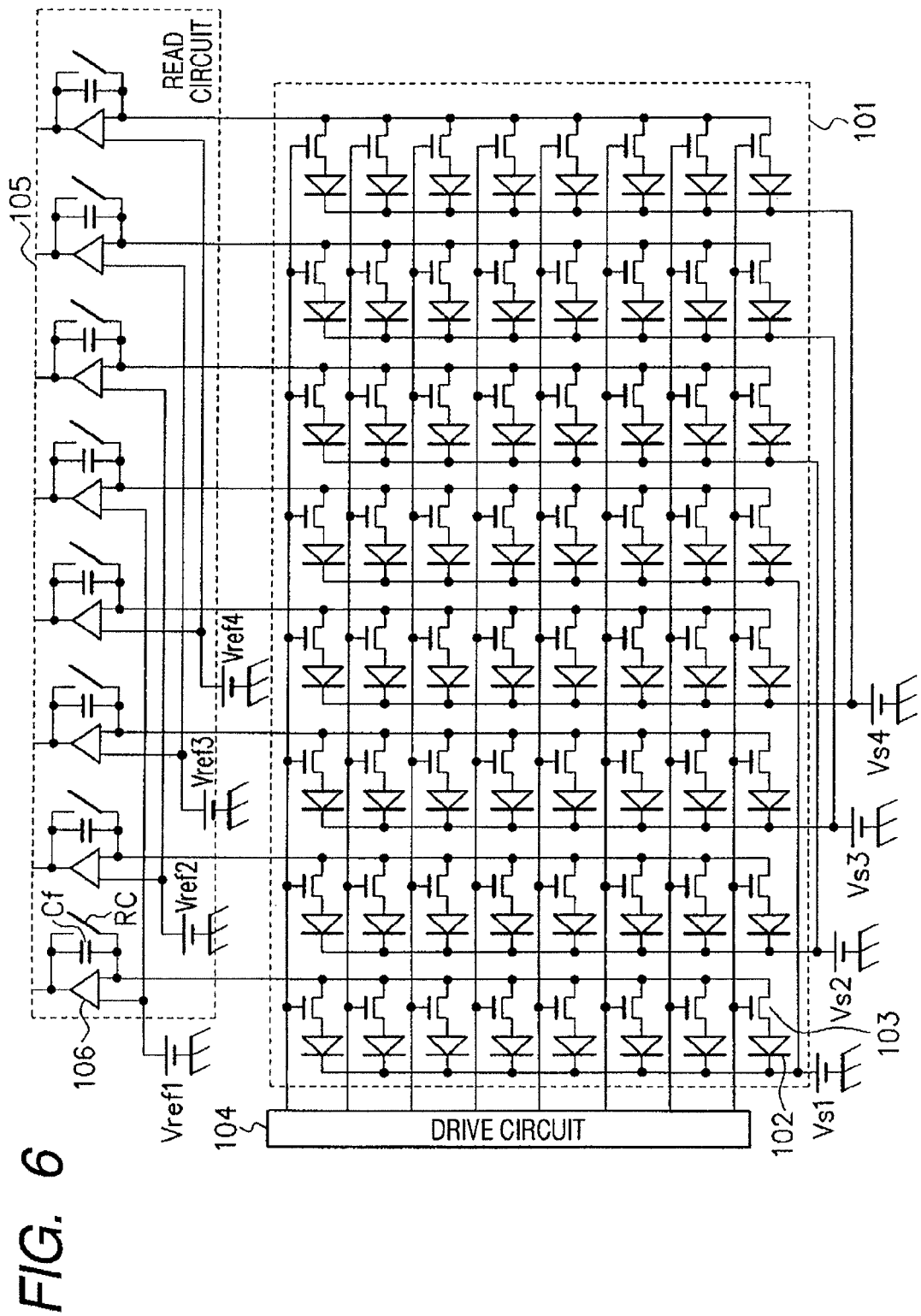
FIG. 6 is a schematic chart of the circuit of the radiation imaging apparatus according to the third mode for embodying the present invention.

FIG. 6 is a schematic chart of the circuit of the radiation imaging apparatus according to the third mode for embodying the present invention. The features of the present mode for embodying the present invention are described below in two points. That is, the read-out circuit 105 is divided into four systems (groups), and to each of the reference potential terminals of the four divided operational amplifiers 106, the voltage Vref1, Vref2, Vref3, and Vref4 of unrelated and independent power sources having the same voltage value are input. In addition, the area sensor array 101 is divided into four systems (groups) in bias wiring, and the voltages Vs1, Vs2, Vs3, and Vs4 of the unrelated and independent power sources having the same voltage value are supplied to the bias wiring of each system (group).

The reference voltage Vref1 is input to the operational amplifier 106 in the first column, fifth column, etc. The reference voltage Vref2 is input to the operational amplifier 106 in the second column, sixth column, etc. The reference voltage Vref3 is input to the operational amplifier 106 in the third column, seventh column, etc. The reference voltage Vref4 is input to the operational amplifier 106 in the fourth column, eighth column, etc.

The bias voltage Vs1 is supplied to the bias wiring connected to the cathode of the photodiode 102 in the first column, fifth column, etc. The bias voltage Vs2 is supplied to the bias wiring connected to the cathode of the photodiode 102 in the second column, sixth column, etc. The bias voltage Vs3 is supplied to the bias wiring connected to the cathode of the photodiode 102 in the third column, seventh column, etc. The bias voltage Vs4 is supplied to the bias wiring connected to the cathode of the photodiode 102 in the fourth column, eighth column, etc.

In the present configuration, the line noise components caused by the reference power source voltages Vref1 to Vref4 of the read out circuit 105 is reduced to ½, and the line noise components caused by the fluctuation of the sensor bias source voltages Vref1 to Vref4 is also reduced to ½. The configuration of the present mode for embodying the present invention is more effective as compared with the first and second modes for embodying the present invention in the radiation imaging apparatus using a large area sensor array 101 having a large parasitic capacitor of the signal wiring 110.

Fourth Mode for Embodying the Present Invention

Figure 7:
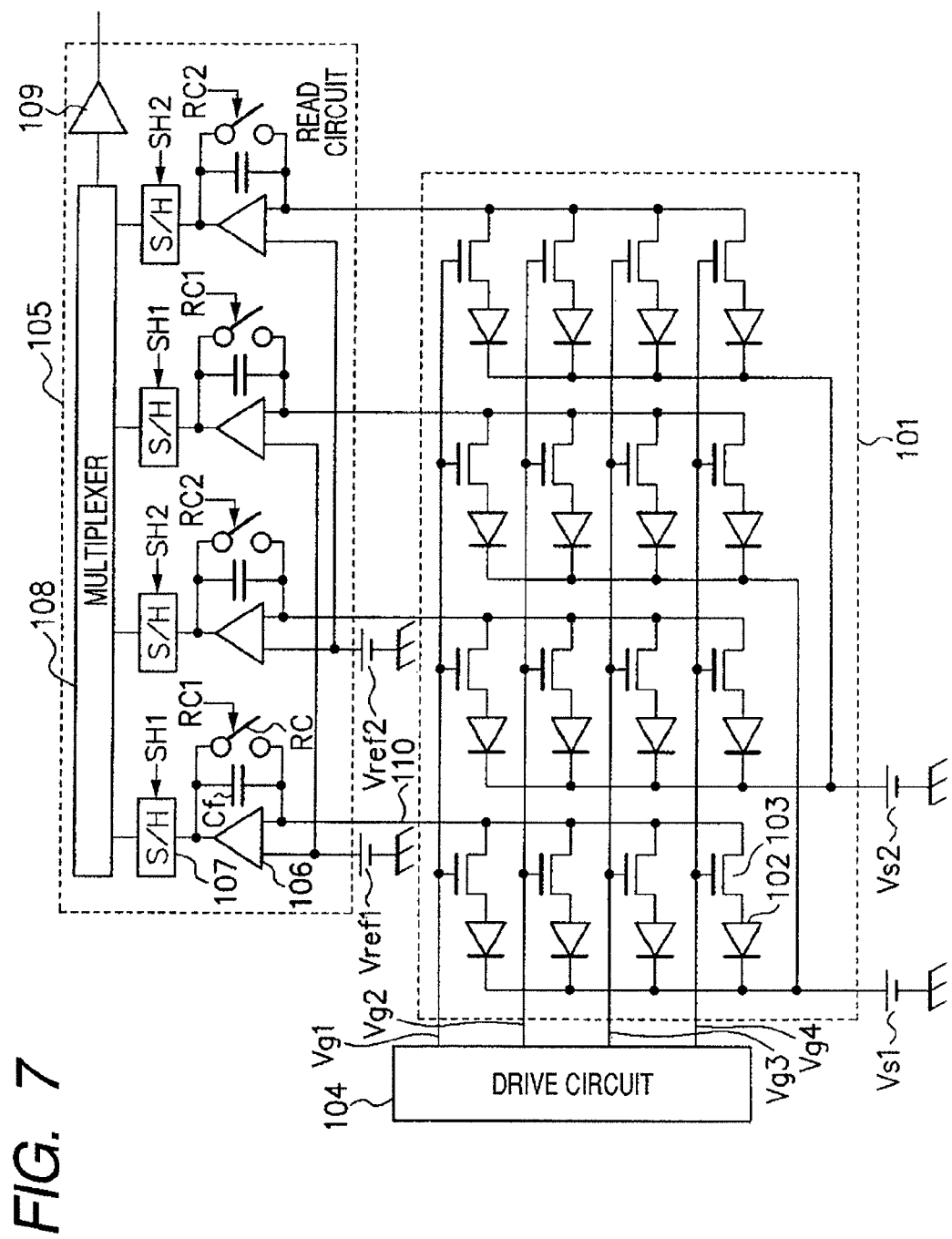
FIG. 7 is a schematic chart of the circuit of the radiation imaging apparatus according to the fourth mode for embodying the present invention.
Figure 8:
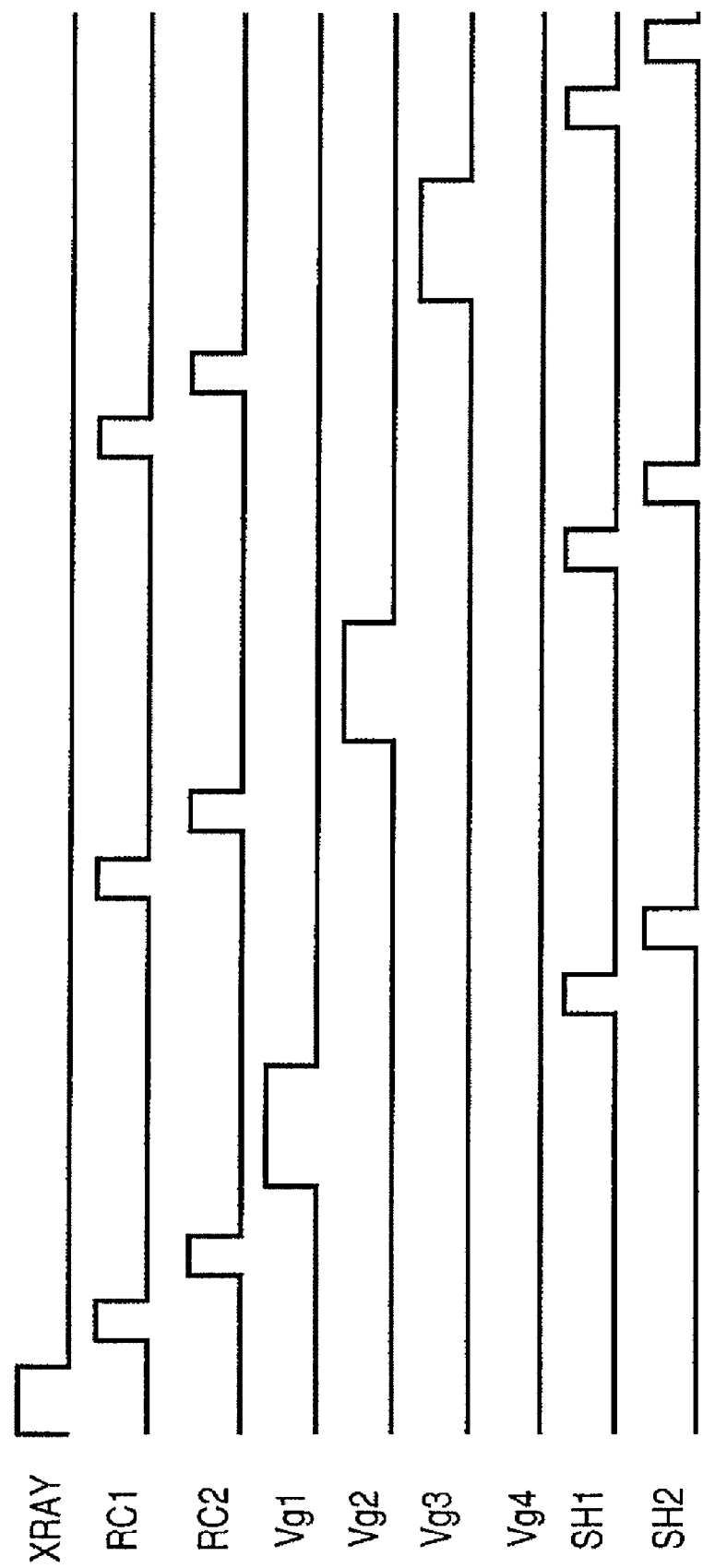
FIG. 8 is a timing chart of the radiation imaging apparatus according to the fourth mode for embodying the present invention.

FIGS. 7 and 8 are schematic charts and timing charts illustrating the radiation imaging apparatus according to the fourth mode for embodying the present invention. The basic configuration is similar to that according to the third mode for embodying the present invention, but different in the following point. That is, the present mode for embodying the present invention has the configuration in which the reference potential Vref1 and Vref2 are supplied to the read out circuit 105 divided into two systems (groups), and the reset signals RC1, RC2, and the sample hold signals SH1 and SH2 are divided into two systems (groups) for supply.

The reference voltage Vref1 is input to the operational amplifier 106 in the odd column (first column and third column, etc.). The reference voltage Vref2 is input to the operational amplifier 106 in the even column (second column and fourth column, etc.). The reference voltages Vref1 and Vref2 are the voltages of the unrelated and independent power sources having the same voltage value.

The bias voltage Vs1 is supplied to the bias wiring connected to the cathode of the photodiode 102 in the odd column (first column and third column, etc.). The bias voltage Vs2 is supplied to the bias wiring connected to the cathode of the photodiode 102 in the even column (second column and fourth column, etc.). The bias voltages Vs1 and Vs2 are the same in voltage value, but the voltages of unrelated and independent power sources.

A plurality of reset switches (reset circuits) RC are provided corresponding to a plurality of signal wiring 110. The reset switch RC1 is input to the control terminal of the switch RC in the odd column (first column and third column, etc.). The reset switch RC2 is input to the control terminal of the switch RC in the even column (second column and fourth column, etc.). The reset signals RC1 and RC2 are different in the timing at which they enter a high level. The switches RC of the reset signals RC1 and RC2 are turned on with the different high-level timing for each system (group) in the odd and even columns.

The plurality of sample and hold circuits 107 are provided corresponding to a plurality of signal wirings 110. The sample and hold signal SH1 is input to the control terminal of the sample and hold circuit 107 in the odd columns (first column and third column, etc.). The sample hold signal SH2 is input to the control terminal of the sample and hold circuit 107 in the even columns (second column and fourth column, etc.). The sample hold signals SH1 and SH2 are different in the timing at which they enter a high level. The sample and hold circuit 107 of the sample and hold signals SH1 and SH2 performs sampling and holding with the timing of different high level for each system (group) in the odd and even columns, and holds a voltage.

The X-rays enter the radiation imaging apparatus with high level timing of the signal XRAY from the radiation irradiating unit such as an X-ray source. The X-rays are converted into light (visible light) of a wavelength band detected by the photodiode 310 by the phosphor layer 315 (FIG. 4). The photodiode 310 converts the light into an electrical signal (charge). Next, the switch RC in the odd column is turned on by the pulse of the reset signal RC1, and the charge storage capacitor Cf of the operational amplifier 106 in the odd column and the signal wiring 110 are reset to the potential Vref1. Next, the switch RC in the even column is turned on by the pulse of the reset signal RC2, and the charge storage capacitor Cf of the operational amplifier 106 in the even column and the signal wiring 110 are reset to the potential Vref2. Then, a transfer pulse is applied to the drive wiring Vg1, and the TFT 103 commonly connected to the drive wiring Vg1 is turned on, and the signal based on the charge generated by the photodiode 102 in the first row is transferred to the operational amplifier 106 of the read out circuit 105 through the TFT 103 and the signal wiring 110. The operational amplifier 106 converts the charge of the signal wiring 110 to a voltage.

Next, the pulse of the sample and hold signal SH1 is applied, and the sample and hold circuit 107 in the odd column samples the output voltage of the operational amplifier 106 in the odd column, and holds it. Next, the pulse of the sample and hold signal SH2 is applied, and the sample and hold circuit 107 in the even column samples the output voltage of the operational amplifier 106 in the even column, and holds it. The multiplexer 108 converts the output voltage of the sample and hold circuit 107 in all columns into a serial signal. The output amplifier 109 amplifies and output the output voltage of the multiplexer 108.

Then, according to the reset signals RC1 and RC2, the charge storage capacitor Cf of the operational amplifier 106 in the odd and even columns and the signal wiring 110 are reset to the potential Vref1 and Vref2. Then, a transfer pulse is applied to the drive wiring Vg2, and the signal according to the charge of the photodiode 102 in the second row is read to the read out circuit 105 through the TFT 103 and the signal wiring 110. A similar operation is repeated on the drive wiring Vg3 and the following, and the charge of the entire sensor array 101 is read.

As illustrated by the timing chart in FIG. 8, the signals RC1, RC2, SH1, and SH2 are input with shifted timing. With this configuration, the timing of sampling the signals of each of the drive wiring Vg1 through Vg4 is shifted. Therefore, in addition to the line noise caused by the fluctuation of the power source supplied to the radiation imaging apparatus, the line noise caused by external noise propagated through a space, a housing, and an AC line can also be reduced.

The present mode for embodying the present invention sets the timing of the reference power source voltages Vref1 and Vref2 of the read out circuit 105, the reset signals RC1 and RC2, and the sample hold signals SH1 and SH2 as two systems (groups) of even and odd columns. However, it is clear and more preferable that the effect of reducing the line noise can be increased by changing the relative phases as a multi-system (group).

Fifth Mode for Embodying the Present Invention

Figure 9:
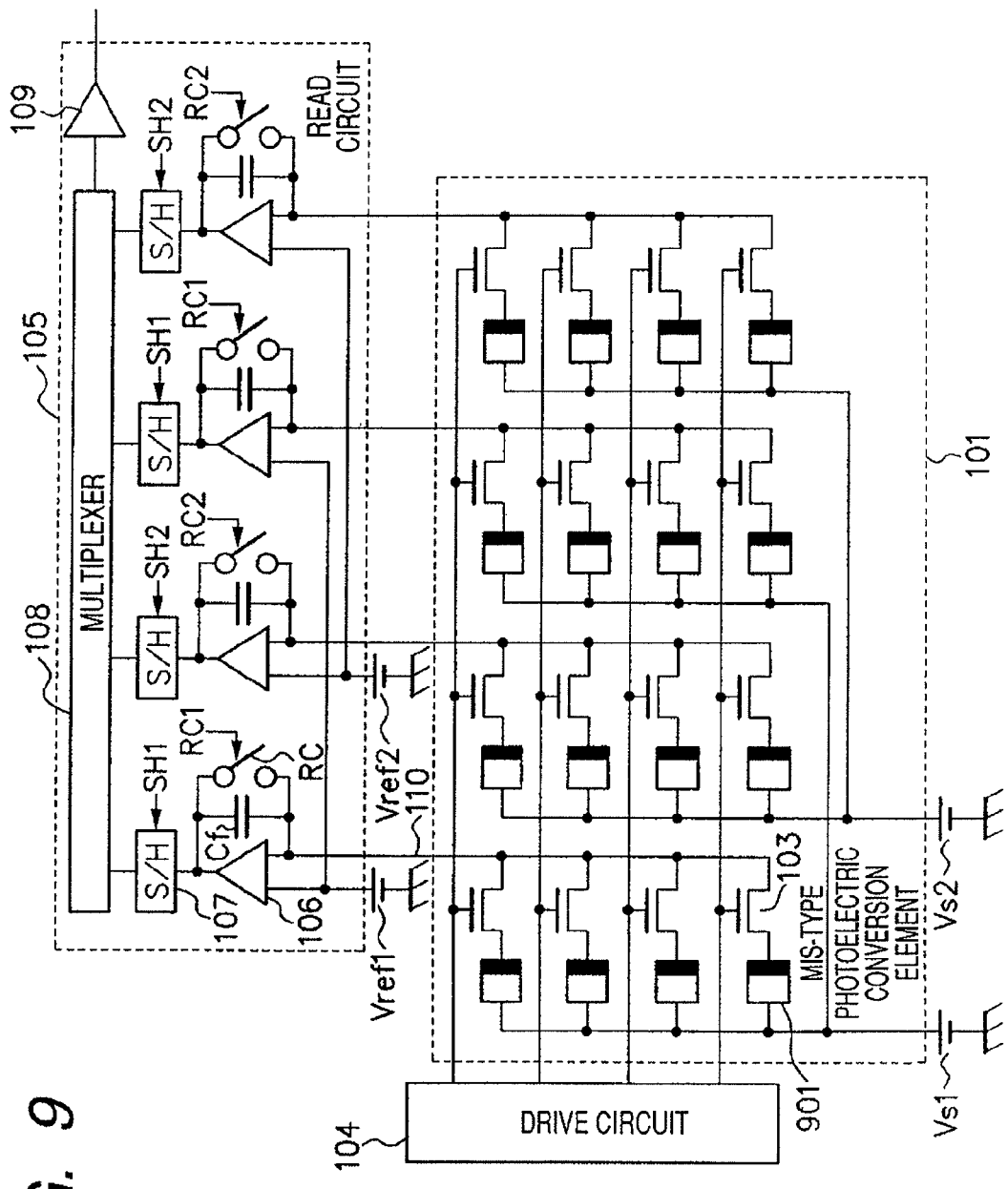
FIG. 9 is a schematic chart of a circuit of the radiation imaging apparatus according to the fifth mode for embodying the present invention.
Figure 10:
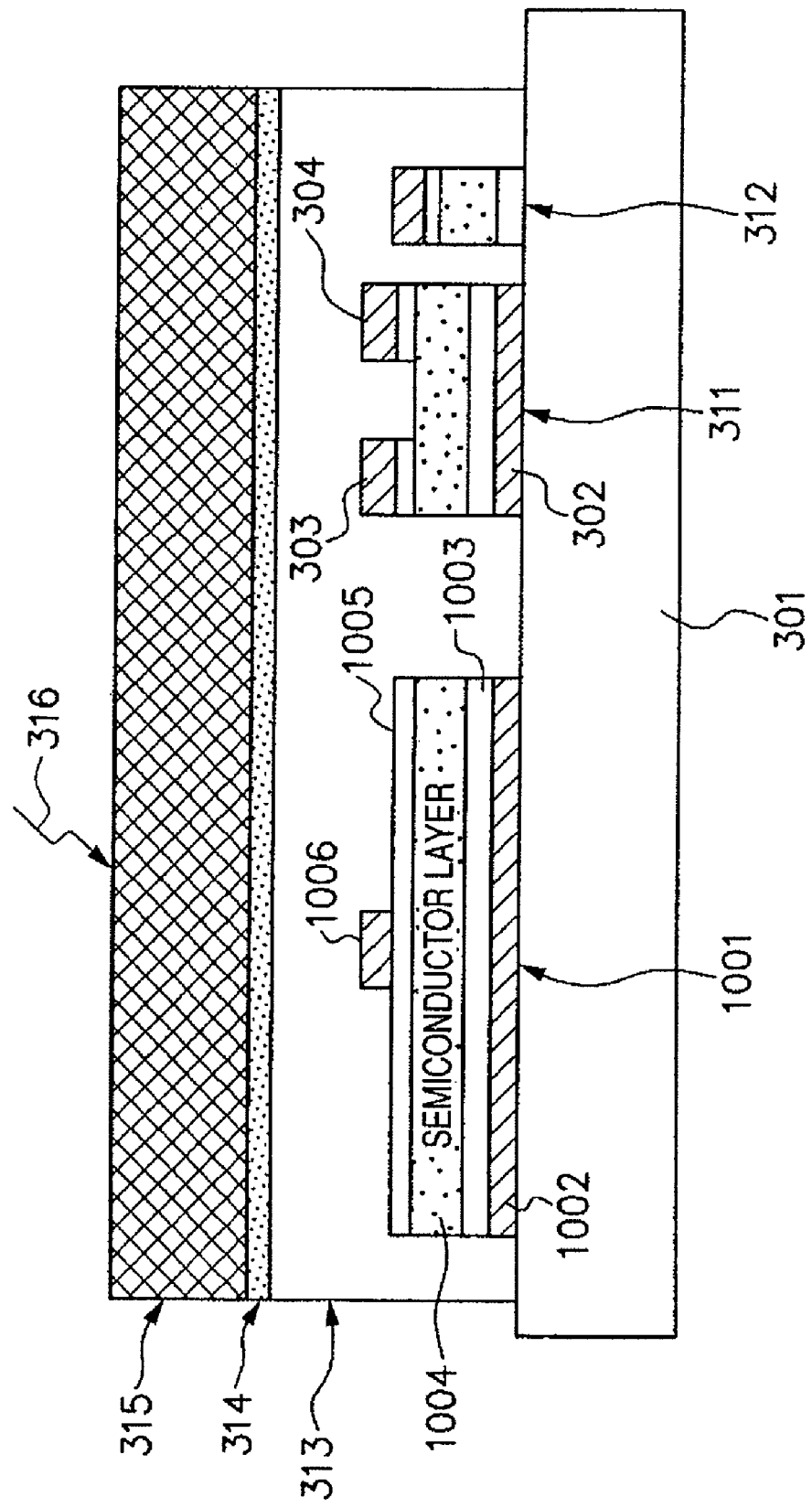
FIG. 10 is a sectional view of the pixels of the area sensor array for use in the radiation imaging apparatus according to the fifth mode for embodying the present invention.

FIGS. 9 and 10 are explanatory views of the radiation imaging apparatus according to the fifth mode for embodying the present invention. FIG. 9 is a schematic chart illustrating the circuit, and FIG. 10 is a sectional view of the pixels of the area sensor array 101. The basic operations are similar to those illustrated in FIG. 7 according to the fourth mode for embodying the present invention, but different in the following point. That is, in the present mode for embodying the present invention, the photoelectric conversion element of the area sensor array 101 is a MIS-type photoelectric conversion element (MIS-type sensor) 901 of amorphous silicon. That is, the MIS-type photoelectric conversion element 901 is provided for the PIN-type photodiode 102 illustrated in FIG. 7.

The sensor array 101 for use in the radiation imaging apparatus according to the fifth mode for embodying the present invention is described below further in detail by referring to the sectional view illustrated in FIG. 10. The layer configuration of a MIS-type sensor 1001 is layered in the order of the insulating substrate 301 such as glass, a lower electrode (metal) layer 1002, an insulating layer 1003, an intrinsic semiconductor layer 1004, an n+ type impurity semiconductor layer 1005, an upper electrode (metal) layer 1006, and the protective layer 313 such as a silicon nitride film.

Each semiconductor layer is provided on the insulating substrate 301 by a non-single crystal semiconductor such as amorphous silicon.

Since an example of a radiographing apparatus is illustrated according to the present mode for embodying the present invention, the phosphor layer 315 is provided on the protective layer 313 through the adhesive layer 314. The phosphor layer 315 can be a gadolinium system and cesium iodide, etc. The phosphor layer 315 can be provided without the adhesive layer 314, or provided directly on the protective layer 313 by evaporation etc.

Sixth Mode for Embodying the Present Invention

Figure 11:
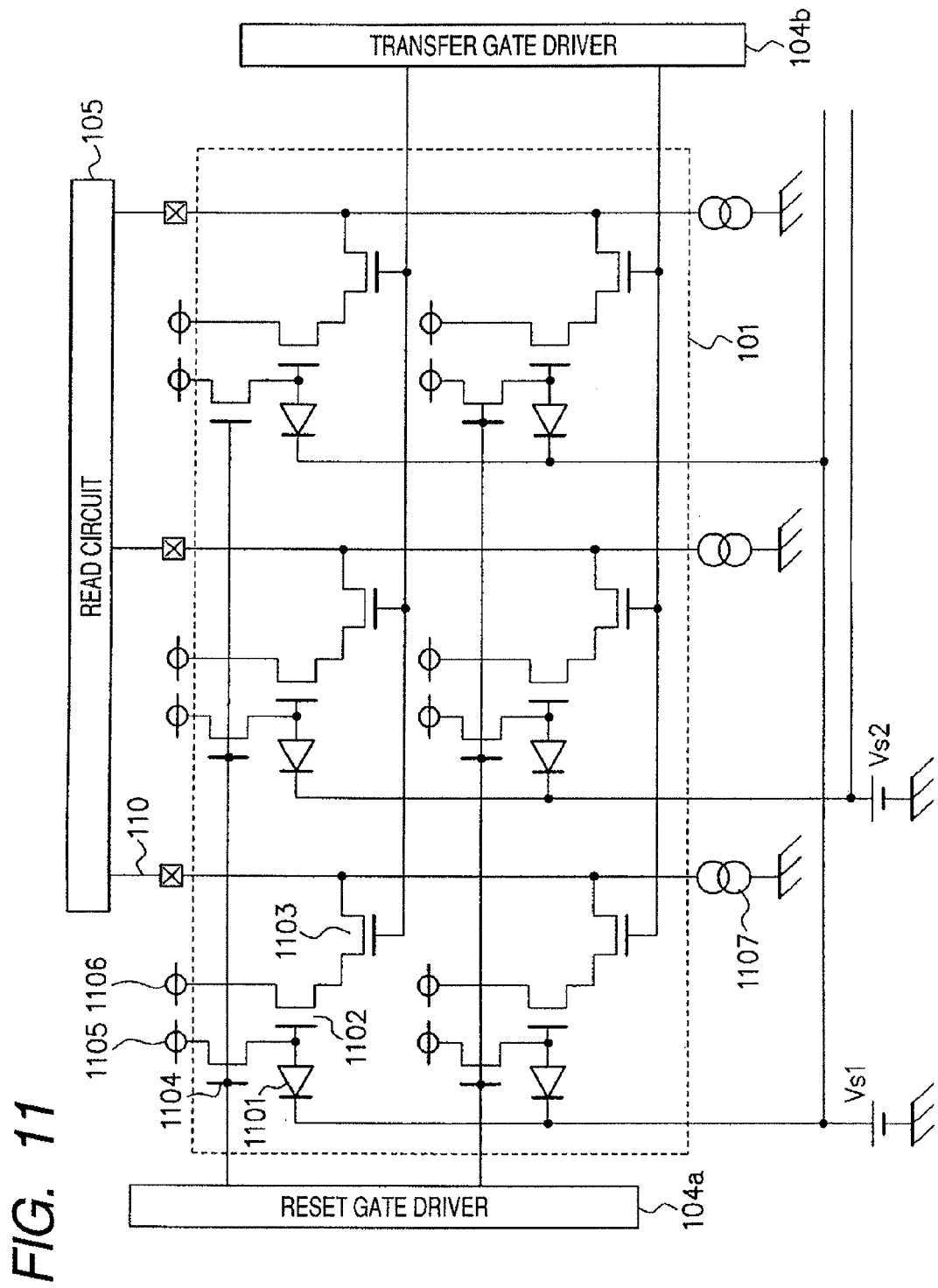
FIG. 11 is a schematic chart of a circuit of the radiation imaging apparatus according to the sixth mode for embodying the present invention.

FIG. 11 is a schematic chart illustrating the circuit of the radiation imaging apparatus according to the sixth mode for embodying the present invention. The present mode for embodying the present invention is fundamentally similar to the second mode for embodying the present invention illustrated in FIG. 5, but different in the following point. That is, in the present mode for embodying the present invention, the pixels of the sensor array 101 are configured by a PIN-type photodiode 1101, a resetting TFT 1104, a source follower TFT 1102, and a transfer TFT 1103. The source electrode of the transfer TFT 1103 of each pixel is connected to the signal wiring 110.

The bias voltage Vs1 is connected to the cathode of the PIN-type photodiode 1101 in the odd column. The bias voltage Vs2 is connected to the cathode of the PIN-type photodiode 1101 in the even column. A resetting gate driver 104*a* supplies a voltage to the gate of the resetting TFT 1104 through the resetting drive wiring. The resetting TFT 1104 is connected to a reset power source voltage 1105. The source follower TFT 1102 is connected to a source follower power supply voltage 1106. A transferring gate driver 104*b* supplies a voltage to the gate of the transfer TFT 1103 through transferring drive wiring. A constant current source 1107 for operating the source follower TFT 1102 is connected to the signal wiring 110.

When the resetting TFT 1104 is turned on by control of the resetting gate driver 104*a*, the charge of the PIN-type photodiode 1101 is reset. The photodiode 1101 generates charge by photoelectric conversion and stores it. The source follower TFT 1102 outputs a voltage corresponding to the amount of charge accumulated in the photodiode 1101. The transfer TFT 1103 is turned on under control of the transferring gate driver 104*b*, and transfers the output voltage of the source follower TFT 1102 to the signal wiring 110.

Since the area sensor array 101 having the source follower TFT 1102 in the pixels has a large amount of output charge, the configuration of the present mode for embodying the present invention is more preferable.

In the pixel configuration, it is desired that plural systems (groups) of sensor bias voltages Vs1 and Vs2 are provided to reduce line noise, and connect unrelated and independent power sources. As indicated in the fourth mode for embodying the present invention, it is desired to have a configuration in which the reference power source voltages Vref1 and Vref2 of plural systems (groups) of the read out circuit 105 can be input, and an unrelated and independent power sources are connected. Furthermore, the reset power source voltage 1105 and the source follower power supply voltage 1106 can also be divided into plural systems such as even systems and odd systems and unrelated and independent power sources can be connected so that the line noise caused by the power sources can be more preferably reduced.

Seventh Mode for Embodying the Present Invention

Figure 12:
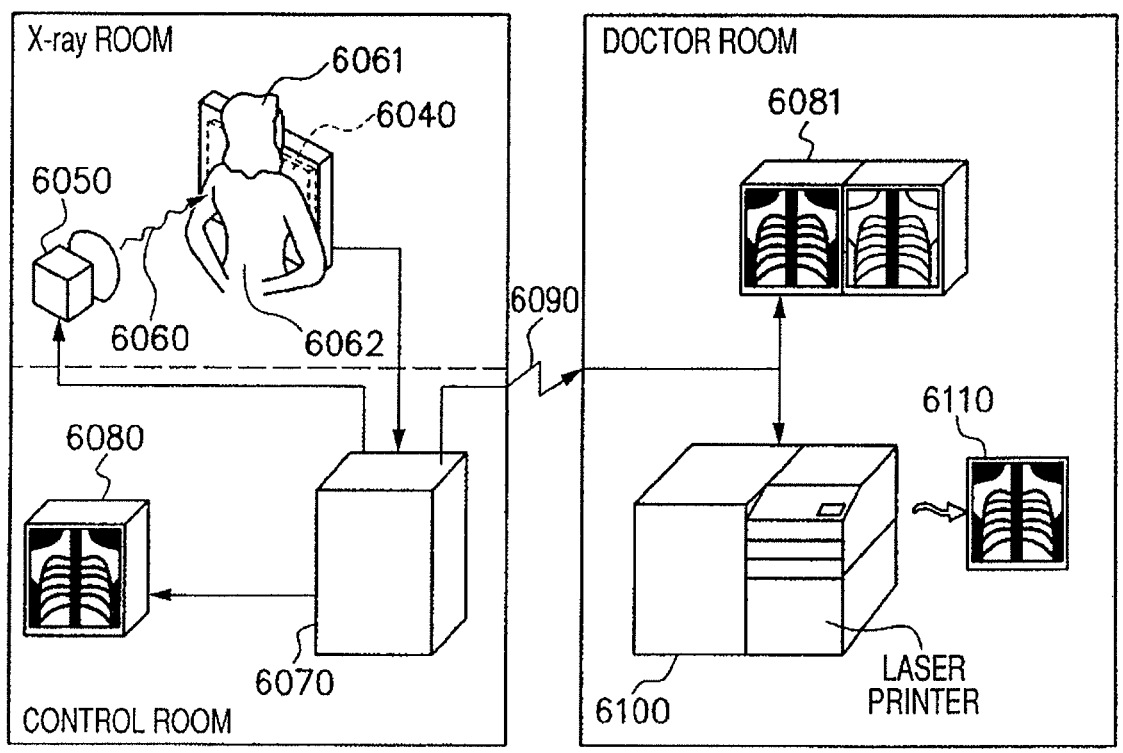
FIG. 12 illustrates the radiographing system according to the seventh mode for embodying the present invention.

FIG. 12 illustrates a system of the X-rays (radiation) radiographing system according to the seventh mode for embodying the present invention. The present mode for embodying the present invention is the radiation imaging apparatus according to the first to sixth modes for embodying the present invention to an X-ray imaging apparatus. The feature of the present X-ray imaging apparatus is described below. That is, a flat panel type radiation imaging apparatus configured by the sensor array 101, the drive circuits 104, 104*a*, and 104*b*, the read-out circuit 105, etc. is provided in an image sensor 6040. An image processor 6070 controls an X-ray tube (X-ray generation apparatus) 6050, an image sensor 6040, a display device 6080, and a communication unit 6090.

In an X-ray room, the X-ray tube (X-ray generation apparatus) 6050 generates X-rays (radiation) 6060, and irradiates the image sensor 6040 with the X-rays (radiation) 6060 through an object 6062. The image sensor 6040 generates image information about the object 6062.

In a control room, the image processor 6070 can display the image information on the display device 6080, or transmit the information to a film processor 6100 through the communication unit 6090.

In a doctor room, the film processor 6100 can display the image information on a display 6081, and print the image information onto a film 6110 by means of the laser printer.

By applying the radiation imaging apparatus according to the first to seventh modes for embodying the present invention, a fluoroscopic radiographing system can be realized by acquiring an excellent radiographed image, with a sufficient radiographing area and display immediacy, and with artifacts due to line noise successfully reduced. In the modes for embodying the present invention, the radiation imaging apparatus can realize a radiation imaging apparatus excellent in characteristic of line noise caused by structures and drive.

A radiation imaging apparatus can be realized by acquiring an excellent radiographed image, with a sufficient radiographing area and display immediacy, which are appropriate for a medical fluoroscopic radiography system, etc., with artifacts due to line noise reduced. Especially, a radiation imaging apparatus can be realized by reducing artifacts due to line noise caused by the fluctuation (power source noise) of a power source provided by an area sensor array, a read-out circuit, and a drive circuit in a simple configuration without using complicated operations.

The above-mentioned modes for embodying the present invention indicate only practical examples in embodying the present invention, and do not limit the interpretation of the technical scope of the present invention. That is, the present invention can be embodied in variations within the scope of the technical concept and the primary features.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An imaging apparatus, comprising:
   a plurality of pixels arranged in row and column directions and each having a conversion element for converting radiation or light into an electrical signal and a switch element, wherein said plurality of pixels are classified into a plurality of groups including first and second groups;

a plurality of signal wirings connected to said plurality of switch elements in the column direction; and a read-out circuit connected to said plurality of signal wirings, wherein said read out circuit comprises a first reset switch corresponding to the signal wiring connected to the switch element of the pixel included in said first group, and a second reset switch corresponding to the signal wiring connected to the switch element of the pixel included in said second group, wherein said first and second reset switches are turned on and off in a period between one period in which electric signals of conversion elements in one row are transferred and another period in which electric signals of conversion elements in another row are transferred, and said first reset switch is turned on or off with timing different from that of said second reset switch.

2. The imaging apparatus according to claim 1, further comprising:
a plurality of drive wirings connected to said plurality of switch elements in the row direction; and
a drive circuit connected to said plurality of drive wirings for providing a voltage for said plurality of drive wirings in a row unit, wherein the electric signal of said conversion element is transferred in a row unit.

3. The imaging apparatus according to claim 1, wherein said first and second groups are respectively an odd column group and an even column group, and said first and second reset circuits are provided independently from each other for the odd column group and the even column group.

4. A radiation imaging system, comprising:
said imaging apparatus according to claim 1; and
a radiation generating unit for generating radiation.

* * * * *